United States Patent [19]

Sachdev et al.

[11] Patent Number: 4,692,205

[45] Date of Patent: Sep. 8, 1987

[54] SILICON-CONTAINING POLYIMIDES AS OXYGEN ETCH STOP AND DUAL DIELECTRIC COATINGS

[75] Inventors: Krishna G. Sachdev; Ranee W. Kwong; Mani R. Gupta, all of Wappingers Falls; Mark S. Chace, Poughkeepsie; Harbans S. Sachdev, Wappingers Falls, all of N.Y.

[73] Assignee: International Business Machines Corporation, Armonk, N.Y.

[21] Appl. No.: 824,893

[22] Filed: Jan. 31, 1986

[51] Int. Cl.$^4$ .................... B44C 1/22; C03C 15/00; C03C 25/06; B29C 37/00
[52] U.S. Cl. .................... 156/643; 29/846; 156/646; 156/652; 156/657; 156/659.1; 156/668; 156/901; 427/96; 428/601; 428/620; 428/473.5; 428/901; 430/314; 430/316; 430/317; 174/68.5
[58] Field of Search ............. 156/643, 644, 646, 652, 156/657, 659.1, 661.1, 662, 668, 901; 427/38, 39, 43.1, 88, 96; 204/192 EC, 192 E; 430/313, 314, 315, 316, 317, 318; 428/620, 601, 473.5, 901; 174/68.5; 357/65; 29/846

[56] References Cited

U.S. PATENT DOCUMENTS 4,430,153 2/1984 Gleason et al. .................... 156/643
4,493,855 1/1985 Sachdev et al. .................... 427/41

Primary Examiner—William A. Powell
Attorney, Agent, or Firm—Jesse L. Abzug

[57] ABSTRACT

The use of silicon-containing polyimide as an oxygen etch barrier in a metal lift-off process and as an oxygen etch stop in the fabrication of multi-layer metal structures is described. In practice, a lift-off layer is applied on a substrate, followed by a layer of silicon-containing polyimide and a layer of photoresist. The photoresist is lithographically patterned, and the developed image is transferred into the silicon-containing polyimide layer with a reactive ion etch using a $CF_4/O_2$ gas mixture. The pattern is transferred to the lift-off layer in a reactive ion etch process using oxygen. Subsequent blanket metal evaporation followed by removal of the lift-off stencil results in the desired metal pattern on the substrate. In an alternate embodiment, the silicon-containing polyimide can be doped with a photoactive compound reducing the need for a separate photoresist imaging layer on the top.

14 Claims, 11 Drawing Figures

SILICON-CONTAINING POLYIMIDES AS OXYGEN ETCH STOP AND DUAL DIELECTRIC COATINGS

BACKGROUND OF THE INVENTION

1. Field of the Invention

This invention relates to the fabrication of semiconductor components such as integrated circuits. In particular, the use of silicon-containing polyimides as an oxygen etch barrier in a metal lift-off process and as an oxygen etch stop in the fabrication of multi-layer metal structures is disclosed.

2. Background Information

Improved materials and processes are required in advanced integrated circuit technology to meet the demands of fabricating high density interconnective multi-level metallurgy systems. In the lift-off method for fabricating fine metal lines, it is required that the contacting films maintain mechanical and interfacial integrity during the various processing steps; have requisite etch characteristics for compatibility with dry etch process schemes; and show the necessary thermal stability to allow high temperature metallization without any problem of outgassing, or image deformation.

The lift-off method for forming metallized structures generally involves the fabrication of a multi-layer stencil comprising a solvent removable polymer film as the base or lift-off layer on a substrate. This lift-off layer is sequentially overcoated with a thin oxygen reactive ion etch (RIE) barrier and a resist layer. The desired pattern in the resist is delineated by standard lithographic techniques and then replicated into the underlying barrier layer by the RIE process using $CF_4$ ambient, followed by $O_2$ to etch the pattern into the lift-off layer. Subsequent blanket metal evaporation and solvent soak (e.g., N-methylpyrrolidone (NMP)) is employed to accomplish the removal of the lift-off stencil, leaving the desired metal pattern intact.

The conventional $O_2$ RIE barrier films as employed in the prior art include $SiO_x$, $Si_3N_4$, sputtered quartz, polydimethylsiloxane resins, and plasma-polymerized organosilicon films. Although the conventional barrier films have been employed effectively as masking layers for $O_2$ RIE processes in multi-layer metal structures, there are several major drawbacks associated with the use of these materials as discussed below.

Relatively high temperatures, e.g., 200° to 275° C. are required for the deposition of inorganic films such as silicon oxide and silicon nitride. These high temperatures, however, can be detrimental to underlying organic polymer films resulting in reticulation and shriveling, in addition to the formation of debris at the organic-/inorganic film interface. Furthermore, inorganic thin films invariably show high defect density (pinholes) which render them unacceptable for the fine line lithography required in the fabrication of high density integrated circuits. Inorganic barrier films in contact with organic polymer films such as polyimide also have problems of process induced stress cracking of the entire structure due to the mismatch in the coefficients of thermal expansion and the residual stress levels in inorganic versus organic films.

The solution coated thin films of spun-on glass utilized in the prior art, Franco, et al., U.S. Pat. No. 4,004,044 suffer from the problem of being susceptible to cracking above 250° to 300° C. when in contact with organic polymer films. Also, the glass-resin formulations have short shelf life and undergo formation of microgels which interfere with the film quality, resulting in a high level of defects.

Plasma polymerized organosilicon films for use as $O_2$ RIE resistant layers as described in U.S. Pat. No. 4,493,855 to Sachdev et al., are free from the problems of the other prior art previously mentioned. However, the solution coated barrier films of this invention provide an inexpensive alternative requiring no special tooling and are specially suited for high volume manufacturing. A further advantage of the barrier films of this invention is the superior adhesion to a variety of organic and inorganic contacting layers without requiring any special surface preparation.

U.S Pat. No. 4,430,153 to Gleason et al., discloses the in-situ conversion of an alkyl polyamide/polyimide surface layer to a silicon-containing alkyl polyamide/-polyimide layer. This process, however, is unsuitable for practical applications requiring metal lift-off structures due to interference of the processing solvents with the mechanical integrity of the solvent removable lift-off layers. Also, this treatment does not provide an effective $O_2$ RIE resistance necessary for pattern transfer into the underlayer.

It is highly desirable to have an $O_2$ RIE barrier which can be used in a manufacturing environment for fabrication of the sub-micron line widths required for high density interconnective metallurgy patterns, and which overcomes all the problems with the prior art.

SUMMARY OF THE INVENTION

Therefore, it is the object of this invention to provide an improved method for fabricating semiconductor devices and packaging using lift-off technology.

It is also an object of this invention to provide a new and superior spun-on oxygen RIE barrier film as part of a lift-off mask employed for forming interconnective metallurgy systems for semiconductor components and packaging.

Another object of this invention is to provide a simple alternative to the $Si_3N_4$, $SiO_x$ deposited by CVD or plasma-enhanced CVD processes, plasma polymerized organosilicons such as HMDS (hexamethyldisilazane) or hexamethyldisiloxane used as oxygen etch stops and dual dielectric in the fabrication of multi-level metal structures.

In accordance with these objects, the fabrication of multi-level metal structures is carried out according to the multi-layer resist process utilizing pre-formed silicon-containing polyimides as $O_2$/RIE barriers and etch stops. The silicon-containing polyimides, either spun-on or sprayed-on, have the requisite properties in terms of the thermal stability, glass transition temperature, mechanical properties, solvent resistance, compatibility of thermal coefficients of expansion with contacting films, and the necessary $O_2$ etch resistance.

Thin films of silicon-containing polyimide formulations utilized in this invention are pinhole free, provide the desired overhang after RIE into the underlying lift-off layer, show no outgassing or fencing during metallization, and allow for clean lift-off in the usual solvent soak to provide excellent metal pattern. The barrier films according to this invention exhibit excellent $O_2$ RIE resistance, adhesion to commonly employed lift-off layers, resist films, inter-level dielectric layers such as polyimide, and inorganic layers such as silicon oxide, silicon nitride, etc.

Due to the superior mechanical properties, thermal stability, excellent adhesion and low dielectric constant, the silicon-containing polyimides, as utilized in this invention, can remain as an integral part of the structure in packaging technology if desired.

BRIEF DESCRIPTION OF THE DRAWING

The foregoing and other advantages of the invention will be more fully understood with reference to the description of the preferred embodiment and with reference to the drawings wherein.

DESCRIPTION OF THE PREFERRED EMBODIMENT

Tri-layer Resist Process

Figure 1A:
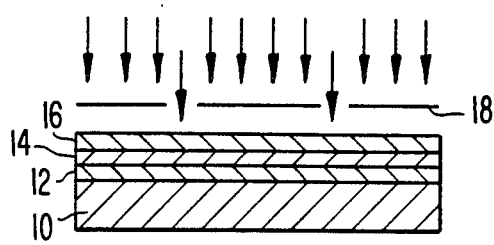
FIGS. 1A–F illustrate schematically the steps of a tri-layer resist process made possible by the present invention.

Referring to FIG. 1A, a substrate 10, such as a silicon wafer having semiconductor devices, is surface treated with a 0.1% aqueous solution of γ-aminopropyltriethoxysilane (γ-APS) by spin application at 2,000 RPM for 30 seconds, followed by a 5 minute bake at 85° C. (hot plate). The surface treatment enhances the adhesion between the substrate 10 and a subsequently applied underlayer 12. The lift-off underlayer is spin applied at 2,000 RPM for 30 seconds and baked at 85° C. for 10 minutes, 150° C. for 15 minutes, and 230° C. for 20 minutes, to form an approximately 2.1 micron thick coating. AZ1350J, commercially available from the Shipley Company has been used advantageously as the lift-off layer.

The lift-off layer is not critical so long as it can be etched with $O_2$ plasma or RIE processing. This layer typically includes organic polymers such as AZ1350, AZ1350J (products of Shipley Co.), polysulfone resin (ICI Company), or soluble polyimides.

Following the application of layer 12, an oxygen RIE barrier 14 is applied. Silicon-containing polyimide #250-65 or #250-50, available commercially from the M&T Company, is diluted 1:2.5 with diglyme, filtered through a 0.45 micron silver filter, and spin-applied on the baked lift-off layer 12 at 3,000 RPM for 30 seconds. A bake sequence of 85° C. for 10 minutes, 150° C. for 15 minutes, and 230° C. for 20 minutes follows, resulting in an approximately 0.25–0.30 micron thick layer of the silicon polyimide.

Next, a layer of resist 16 is applied over the silicon-containing polyimide barrier layer 14. To enhance the adhesion of the resist 16 to the silicon-polyimide layer 14, the surface of silicon-polyimide layer 14 is pretreated with HMDS-γAPE vapor in Freon-TF for 5 minutes or with a 0.1% solution of a γ-APS in toluene by spin coating. The layer of diazonaphthoquinone-novolak resist 16 is applied at 3,000 RPM for 30 seconds followed by a 30 minute bake at 85° C. to form a thick film approximately 0.9–1.1 microns thick.

The resist layer 16 can be a standard resist material known in the art, it may be positive or negative, and may be sensitive to near, mid or deep UV; electron beam; X-ray; ion beam; or laser. Examples are novolak based resists with diazoquinone type of photoactive component, acrylate polymers such as PMMA, polyolefin sulfones, etc. Patterning of the resist can be carried out according to standard lithographic processes.

Figure 1B:
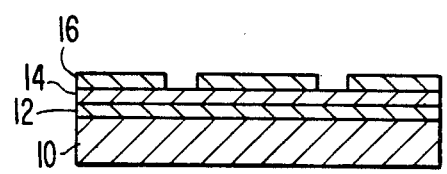
Figure 1C:
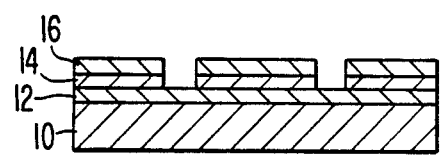

After exposure to mid-UV light through mask 18, resist layer 16 is developed with AZ2401 (Shipley Co.) developer diluted 1:3.5 with deionized water (FIG. 1B). The image in the resist layer 16 is subsequently replicated into the silicon-containing polyimide layer 14 by RIE using a $CF_4$-$O_2$ mixed gas system at a 2.5:1 flow rate ratio at 38–48 mtorr, with power level in the range 250–300 watts. Under these conditions, the barrier layer 14 can be etched at the rate of 1100–1300 Angstroms/min. The resulting structure is shown in FIG. 1C.

Figure 1D:
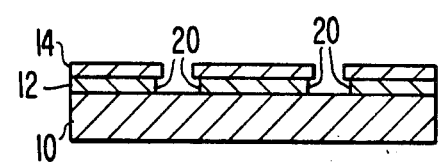

Subsequent image transfer down to the substrate 10 is accomplished by an $O_2$ RIE at 40 mtorr and 300 watts with 50–95% overetch past end point. The resulting structure is seen in FIG. 1D. The overetch provides for the overhang 20 which facilitates the metal lift-off process.

Figure 1E:
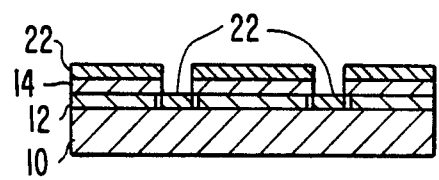
Figure 1F:

Referring to FIG. 1E, the silicon-containing polyimide layer 14 and exposed areas of substrate 10 are sputter cleaned for 6 minutes at 220° C. prior to metallization. A blanket layer of metal 22, such as Al-Cu, is evaporated over the exposed surfaces at 120° to 150° C. Following this evaporation, the lift-off is accomplished by the standard solvent soak in NMP for 2 hours with brief ultrasonic agitation to accelerate removal of the lift-off stencil, leaving the metallurgy network 22 as shown in FIG. 1F. The metal film may be any metal conventionally employed, e.g., aluminum, copper alloy, palladium, platinum, chromium, etc.

In alternate embodiments, soluble polyimide XU284, manufactured by CIBA GEIGY, or other lift-off layers can be used in place of the baked AZ layer 12 without departing from the scope of this invention. The lift-off layer can be 1–5μm in thickness, the silicon polyimide layer is typically in the range 0.15–0.65μm and the imaging layer thickness is adjusted such that the desired level of image resolution and reduction of defect density is achieved. The imaging layer thickness is typically in the range 0.15–7.2μm. All other processing steps would follow as described above.

BI-LAYER RESIST PROCESS

Figure 2A:
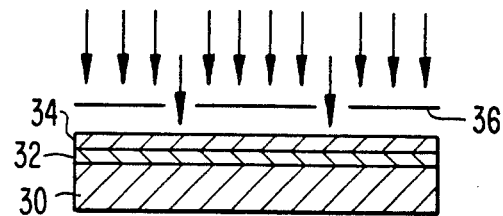
FIGS. 2A–E illustrate schematically the steps of a bi-layer resist process made possible by the present invention.

Referring to FIG. 2A, a substrate 30, which can be a semiconductor wafer or packaging substrate, is provided. A lift-off layer 32, which can be a photoresist material or other polymer, is next applied on the substrate 30 as previously described.

A 10% solution of silicon-polyimide BE221 (available from M&T Company) in NMP is doped with a diazonaphthoquinone-based photoactive compound (PAC). The photoactive compound comprises approximately 18% of the solution. The mixture is filtered through a 0.2 micron silver filter and spin applied on lift-off layer 32. The resulting silicon-polyimide/PAC layer 34 is exposed to mid-UV exposure through mask 38 for approximately 20 seconds.

Figure 2B:
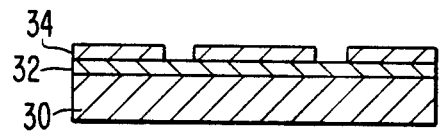
Figure 2C:
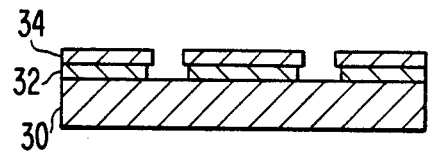

Following solvent development with AZ2401 diluted 1:6 with deionized water or with tetramethylammonium hydroxide and a hot plate bake up to 200° C., the developed pattern appears as in FIG. 2B. Reactive ion etching with $O_2$ at 300 watts transfers the pattern into the lift-off layer 32 as seen in FIG. 2C.

Figure 2D:
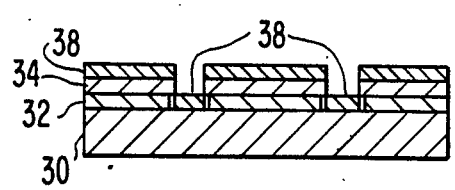
Figure 2E:
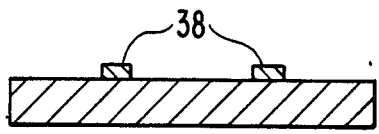

As described in the tri-layer process above, metal 38 is blanket deposited on the layer 34 and exposed areas of substrate 30 (FIG. 2D), resulting in the metallurgy pattern after removal of the lift-off stencil as seen in FIG. 2E.

MATERIAL STRUCTURE AND PROPERTIES

The following silicon-containing polyimides are useful as $O_2$ RIE barriers and/or $O_2$ etch stops:

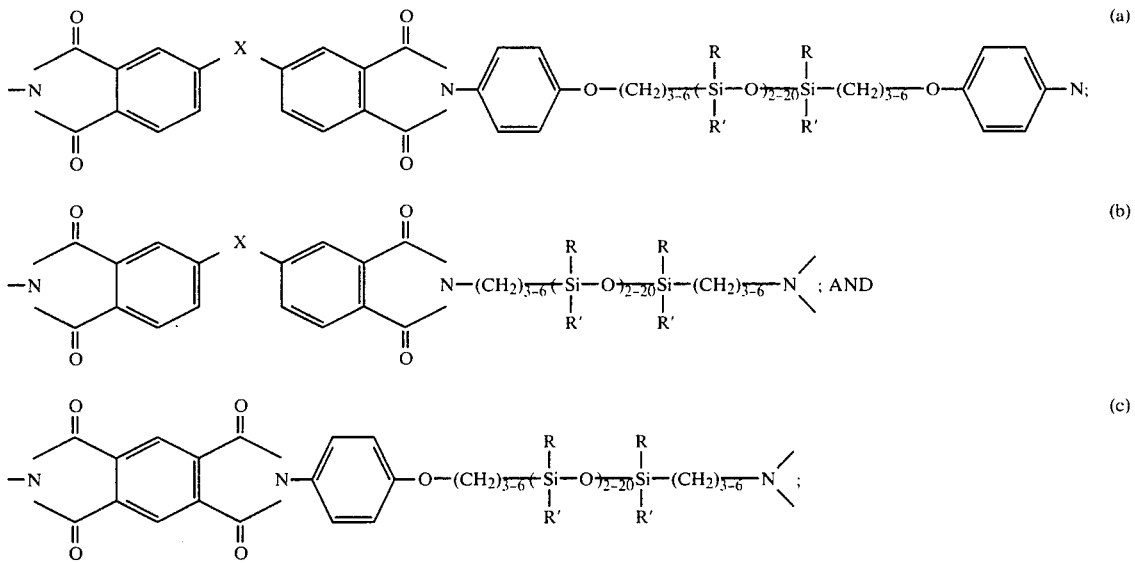

WHERE
X = CO, C(CH$_3$)$_2$, C(CF$_3$)$_2$, O, SO, SO$_2$, S
R = R' = CH$_3$, C$_2$H$_5$, CH$_2$CH$_2$CF$_3$, C$_6$H$_5$

Desirable Material Properties

Thermal Stability: to 400° C. (minimum 250° C.)
Molecular Weight: 20,000 to 100,000 (preferred 30,000 to 50,000)
Dielectric Constant: 2.9-3.5
Glass Transition Temp: >100° C.

While the invention has been particularly shown and described with reference to a preferred embodiment thereof, it will be understood by those skilled in the art that various changes in detail may be made therein without departing from the spirit, scope and teaching of the invention. For example, the base substrate may be silicon wafers, ceramic substrates, polyimide packaging layers, other polymeric films used in semiconductor processing, silicon wafers or ceramic substrates with one or more layers of insulating materials or dielectric layers, etc. Even a layer of silicon-containing polyimide could be present as a dielectric layer. Additionally, other structures of silicon-containing polyimides may be used other then those specifically disclosed. Accordingly, the process herein disclosed is to be considered merely as illustrative, and the invention is to be limited only as specified in the claims.

We claim:

1. A method for depositing metal conductors on a substrate comprising the following steps:
   providing a substrate;
   depositing a lift-off polymer layer on the substrate;
   depositing a layer of silicon-containing polyimide on the lift-off layer;
   depositing a radiation sensitive layer on the silicon-containing polyimide layer;
   imagewise exposing the radiation sensitive layer to radiation;
   developing the imagewise exposed radiation sensitive layer;
   etching the silicon-containing polyimide layer using the developed radiation sensitive layer as an etch mask;
   etching the lift-off layer using the silicon-containing polyimide layer as an oxygen etch mask;
   blanket depositing a layer of metal on the silicon-containing polyimide layer and exposed substrate;
   removing the lift-off layer, the silicon-containing polyimide layer and overlying metal layer, leaving the metal conductors on the substrate.

2. The method as claimed in claim 1 which the lift-off layer is etched using $O_2$.

3. A method for depositing metal conductors on a substrate comprising the following steps:
   providing a substrate;
   depositing a first layer of lift-off material on the substrate;
   depositing a second layer of radiation-sensitized, silicon-containing polyimide on the first layer;
   imagewise exposing the second layer to radiation;
   developing the second layer;
   etching the first layer with oxygen using the developed second layer as a mask;
   blanket depositing a layer of metal on the second layer and exposed substrate;
   removing the first and second layers and overlying metal layer, leaving the metal conductors of the substrate.

4. The method as claimed in claim 1 or 3 wherein the substrate is a semiconductor wafer.

5. The method as claimed in claim 1 or 3 wherein the substrate is a polymeric material.

6. The method as claimed in claim 1 or 3 wherein the substrate is ceramic.

7. The method as claimed in claim 1 or 3 wherein the lift-off material is selected from the group consisting of photoresist, polysulfone and soluble polyimide.

8. The method as claimed in claim 1 or 3 wherein the substrate includes at least one layer selected from the group consisting of silicon oxide, silicon dioxide and silicon nitride.

9. The method as claimed in claim 1 or 3 wherein the silicon-containing polyimide layer is selected from the group consisting of:

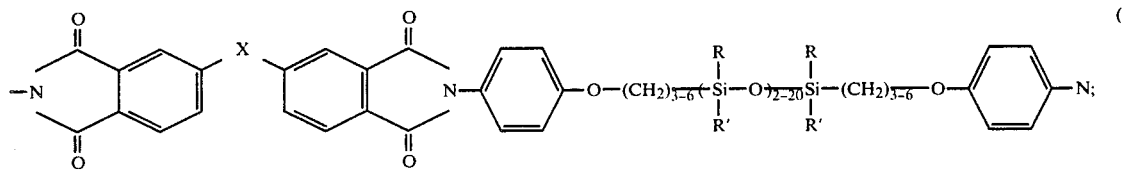

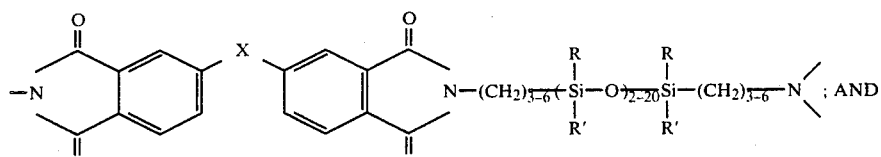

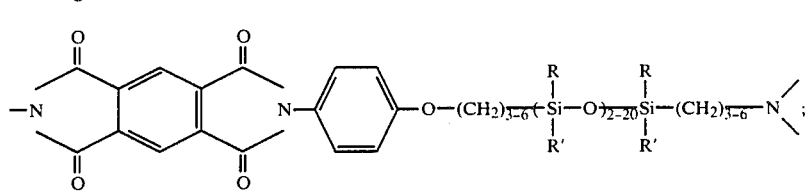

WHERE
X = CO, C(CH₃)₂, C(CF₃)₂, O, SO, SO₂, or S
R = R' = CH₃, C₂H₅, CH₂CH₂CF₃, or C₆H₅

10. The method as claimed in claim 1 or 3 wherein a silicon-containing polyimide dielectric layer is deposited on the substrate prior to the lift-off layer.

11. A multi-level metal structure comprising:
a substrate;
a first dielectric layer covering said substrate;
a silicon-containing polyimide dielectric layer covering said first dielectric layer; and
a pattern of metal conductors overlying the silicon-containing polyimide dielectric layer.

12. The structure as claimed in claim 11 wherein said substrate is a semiconductor wafer.

13. The structure as claimed in claim 11 wherein the substrate is ceramic.

14. The structure as claimed in claim 13 wherein the substrate has at least one metallic layer thereon.

* * * * *